US008826196B2

(12) United States Patent
Sahouria

(10) Patent No.: US 8,826,196 B2
(45) Date of Patent: Sep. 2, 2014

(54) INTEGRATION OF OPTICAL PROXIMITY CORRECTION AND MASK DATA PREPARATION

(71) Applicant: Mentor Graphics Corporation, Wilsonville, OR (US)

(72) Inventor: Emile Y Sahouria, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/754,378

(22) Filed: Jan. 30, 2013

(65) Prior Publication Data

US 2014/0215416 A1 Jul. 31, 2014

(51) Int. Cl.
*G06F 17/50* (2006.01)

(52) U.S. Cl.
USPC .......................................................... 716/55

(58) Field of Classification Search
CPC ........ G06F 17/5068; G03F 1/144; G03F 1/36
USPC .............................. 716/50–56; 326/37–38, 41
See application file for complete search history.

(56) References Cited

U.S. PATENT DOCUMENTS

| 8,108,804 | B2* | 1/2012 | Graur et al. ...................... 716/52 |
| 8,286,107 | B2* | 10/2012 | Smayling et al. ................ 716/53 |
| 8,434,031 | B2* | 4/2013 | Granik ............................. 716/54 |
| 2002/0078427 | A1* | 6/2002 | Palmer et al. .................... 716/19 |
| 2004/0044984 | A1* | 3/2004 | Keogan et al. ................... 716/21 |
| 2008/0005718 | A1* | 1/2008 | Green .............................. 716/21 |
| 2008/0256500 | A1* | 10/2008 | Cobb et al. ......................... 716/5 |
| 2009/0276751 | A1* | 11/2009 | Cao et al. ......................... 716/21 |
| 2010/0081294 | A1* | 4/2010 | Ogawa et al. ................. 438/795 |
| 2010/0185999 | A1* | 7/2010 | Graur et al. ..................... 716/20 |
| 2011/0061030 | A1* | 3/2011 | Mansfield et al. .............. 716/50 |
| 2011/0252386 | A1* | 10/2011 | Fujimura et al. ................ 716/53 |
| 2011/0278731 | A1* | 11/2011 | Fujimura et al. .............. 257/774 |
| 2012/0042291 | A1* | 2/2012 | Granik et al. ................... 716/55 |
| 2012/0053892 | A1* | 3/2012 | Matsuoka et al. ............ 702/167 |
| 2012/0221985 | A1* | 8/2012 | Fujimura ........................ 716/55 |
| 2012/0278770 | A1* | 11/2012 | Fujimura et al. ................ 716/53 |
| 2012/0311511 | A1* | 12/2012 | Taguchi et al. ................. 716/52 |
| 2012/0329289 | A1* | 12/2012 | Fujimura et al. .............. 438/795 |
| 2013/0042213 | A1* | 2/2013 | Sahouria ........................ 716/55 |
| 2013/0070222 | A1* | 3/2013 | Fujimura ........................ 355/53 |
| 2013/0191795 | A1* | 7/2013 | Lippincott et al. .............. 716/53 |
| 2013/0198700 | A1* | 8/2013 | Sakajiri .......................... 716/53 |

OTHER PUBLICATIONS

Fujimura, Aki, "Model-based mask data preparation using overlapping shots: Making Opticla lithography cost-effective for 20-nm devices", 2011, European Mask and Lithography Conference 2011. pp. 1-6.*

(Continued)

*Primary Examiner* — Stacy Whitmore

(57) ABSTRACT

Aspects of the invention relate to techniques for integrating optical proximity correction and mask data preparation. First mask writer instructions for a layout design are simulated to generate a mask contour. Based on the generated mask contour, first layout data for the layout design are adjusted for optical proximity correction to generate second layout data. Using the generated second layout data as mask target, the first mask writer instructions are adjusted to generate second mask writer instructions. The above process may be iterated until an end condition is met.

20 Claims, 5 Drawing Sheets

(56) References Cited

OTHER PUBLICATIONS

Chua, G., et al., "Optimization of mask shot count using MB-MDP and lithography simulation", 2011, Proc. of SPIE, vol. 8166. pp. 1-11.*

Fujimura, Aki, "Understanding shpae-dependent mask CD-uniformity", Sep. 1, 2012, Solid State Technology Insights for electronics Manufacturing, pp. 1-11.*

"Reducing shot count through optimization based facture," Lin et al., Proceedings of SPIE, vol. 8166, 2011.

"Writing 'wavy' metal 1 shapes on 22 nm logic wafers with less shot count," Zable et al., Photomask Japan 2010.

"Model based mask process correction and verification for advanced process nodes," Lin et al., Proceedings of SPIE, vol. 7274, 2009.

"An enhanced measure of mask quality using separated models", Adamov et al., Proceedings of SPIE, vol. 8522, 2012.

* cited by examiner

Flow chart
400

INTEGRATION OF OPTICAL PROXIMITY CORRECTION AND MASK DATA PREPARATION

FIELD OF THE INVENTION

The present invention relates to photolithographic processing technologies. Various implementations of the invention may be particularly useful for creating masks with curved or angled features.

BACKGROUND OF THE INVENTION

As photolithography is pushed to fabricate deep-subwavelength devices, photomask (or mask) preparation is becoming more critical than ever before. This is in part due to the fact that mask patterns have become more complex than conventional Manhattan shapes. Multi-patterning and other techniques needed to extend the 193 immersion capabilities usually depend on a large amount of decoration with optical proximity correction (OPC) shapes. Unlike simple orthogonal SRAFs, the SRAFs for 22 nm/20 nm technology nodes tend to be blobs or curvilinear lines. In the contact and via layers, and particularly for isolated features, extensive use of sub-resolution assist features (SRAFs) is needed to produce the required process window. Another source of complex mask patterns is inverse lithography. Masks computed through use of inverse lithography are known to provide significantly better lithographical performance even than conventional model-based OPC. Such masks, however, generally contain patterns with smaller segments and curved shapes.

Masks that preserve natural output shapes from inverse lithography solutions are shown to have better lithography process window than their Manhattan counterparts. To manufacture masks with complex shapes, a straightforward approach is to represent curvilinear shapes with Manhattan segments. This may not only lead to a large number of shots, but also affect mask pattern fidelity. Model-based mask data preparation (MDP) methods may achieve shot count savings and preserve curved shapes. Some of these methods use smooth and curved contours as mask targets and adjust the numbers, positions and sizes of rectangular shots for optimization. No matter which model-based methods are employed, there will still be residue mask errors. These mask errors can be amplified upon wafer print, degrading pattern image fidelity and resulting in assist feature printing. The sensitivity of the wafer print to mask errors cannot be predicted without information about the optical configuration that will be used to print the wafer. Also the sensitivity is expected to vary so widely across the layout as to preclude the application of a single guard band specification. It is thus desirable to combine mask data preparation with optical proximity correction (OPC), at least in a refinement process.

BRIEF SUMMARY OF THE INVENTION

Aspects of the invention relate to techniques for integrating optical proximity correction and mask data preparation. In an OPC-MDP process, according to various embodiments of the invention, first mask writer instructions for a layout design are simulated to generate a mask contour. The layout design represents at least a portion of an integrated circuit design. The first mask writer instructions may be derived from an initial MDP operation that performs a conventional fracturing process on initial layout data, from a previous iteration of the OPC-MDP process, or an MDP global operation. The initial layout data may be generated by an OPC global operation.

Based on the generated mask contour, first layout data for the layout design are adjusted for optical proximity correction to generate second layout data. The first layout data may be the initial layout data or the layout data from a previous iteration of the OPC-MDP process. Traditional OPC or inverse lithography may be employed for this operation. Using the generated second layout data as mask target, the first mask writer instructions are adjusted to generate second mask writer instructions.

The above OPC-MDP process may be iterated until an end condition is met. One such end condition is residue mask and wafer errors are less than threshold error values. Another end condition is the number of iterations reaches a threshold number.

DETAILED DESCRIPTION OF THE INVENTION

Figure 1:
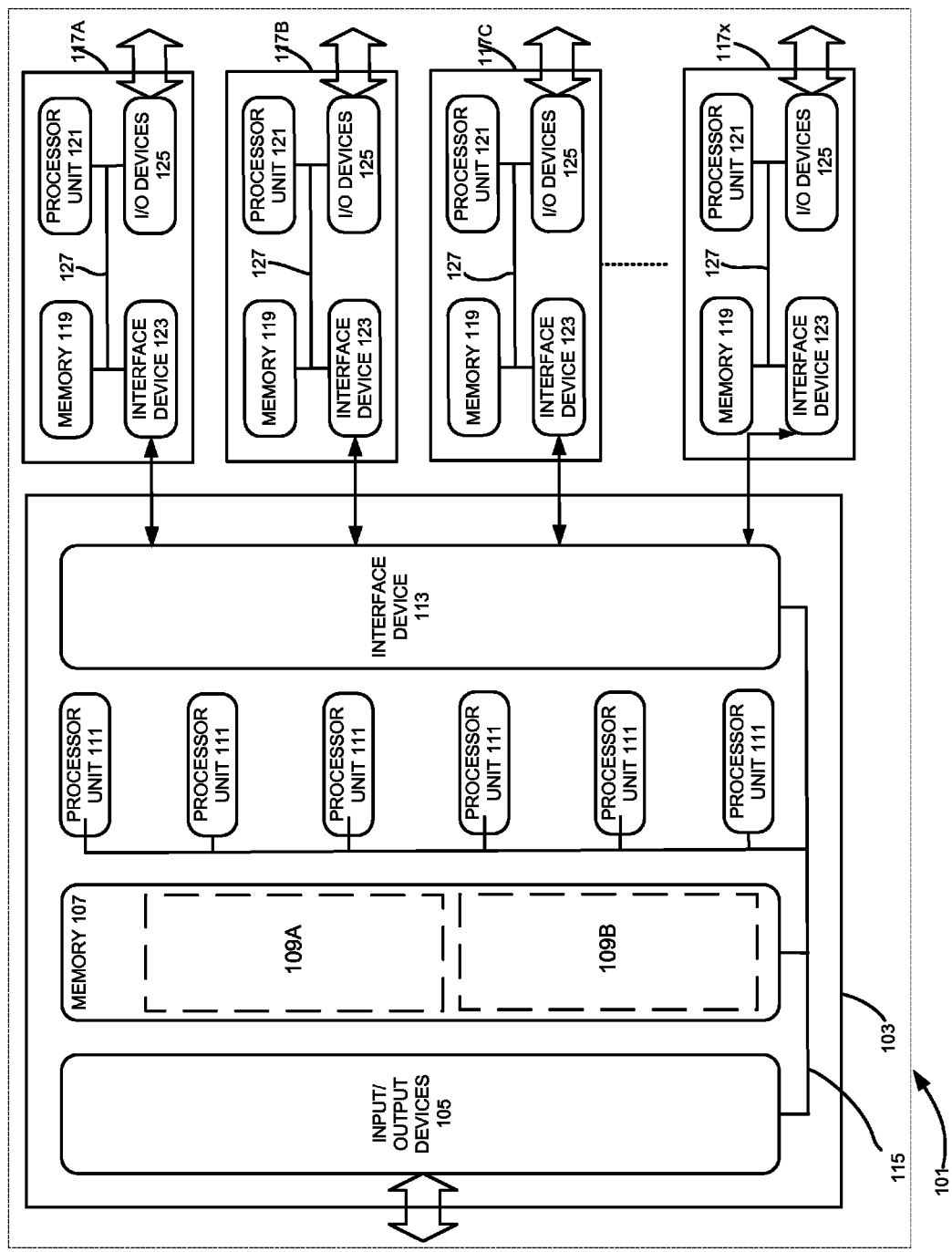
FIG. 1 illustrates an example of a computing system that may be used to implement various embodiments of the invention.

Various aspects of the present invention relate to integrating optical proximity correction and mask data preparation. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "simulate," "adjust" and "generate" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
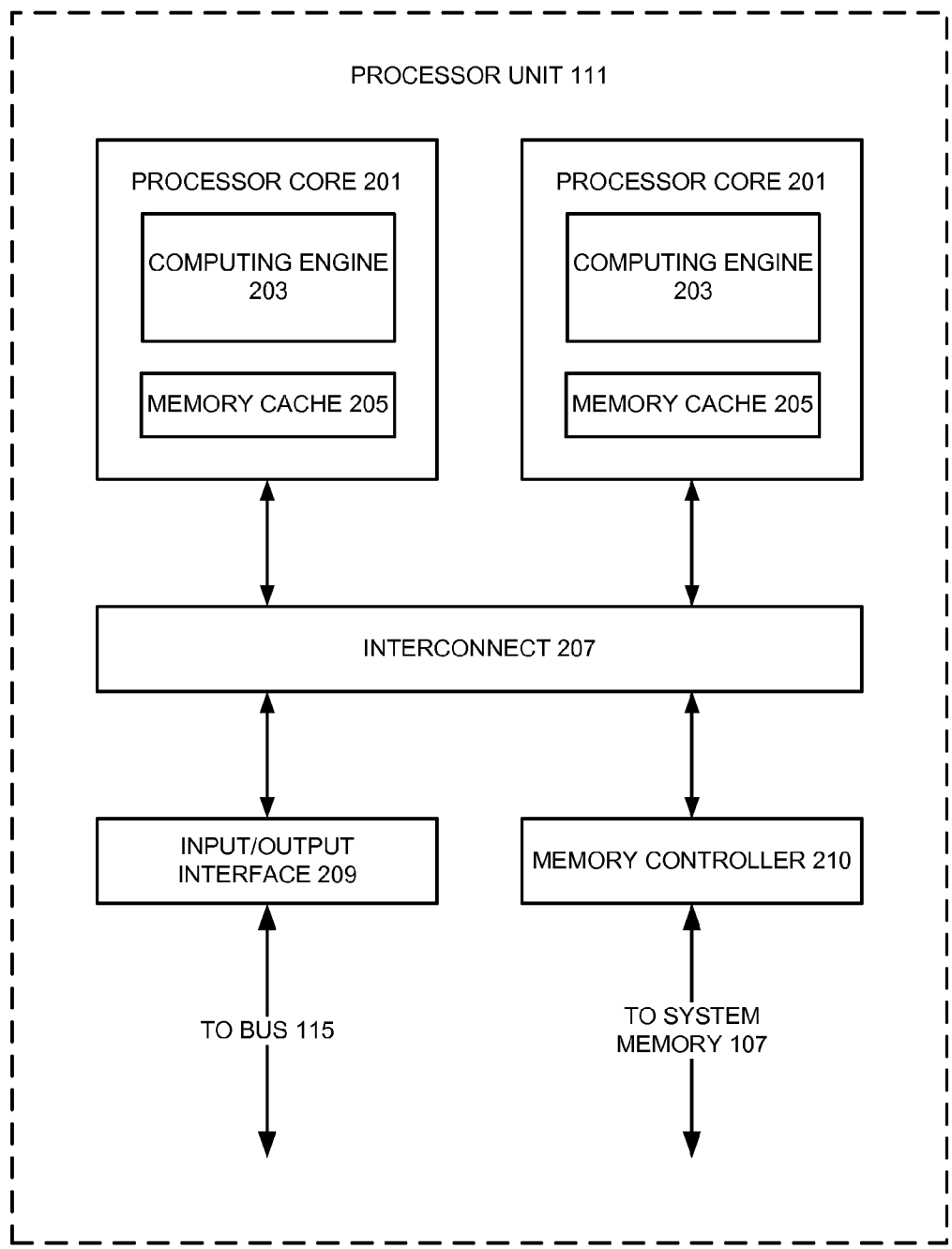
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Model-Based Mask Data Preparation

As noted previously, model-based mask data preparation methods may achieve shot count savings and preserve curved shapes. An optimization based fracture process, discussed in a paper entitled "Reducing shot count through optimization based facture," Lin et al., Proceedings of SPIE, Vol. 8166, which is incorporated herein by reference, allows for overlapping shots, a significant departure from traditional fracture. An e-beam blur model is incorporated to simulate the expected mask contour from the overlapping shot shapes. Convolved with Gaussian kernels, overlapping of rectangles or trapezoids can produce smooth contours with round corners. While the curvature present in the mask target may be reproduced exactly in some cases, it will not be possible to achieve arbitrary fidelity between the optimization based fracture result and the mask target without increasing the number of shots. In other words, some tradeoff between mask pattern fidelity and achievable shot count savings may be needed in a majority of cases.

E-beam blur may be used to smooth the target of a Manhattan input for the purposes of providing a smooth contour. However, this approach implies that the mask maker is allowed some liberty to interpret the lithography intent. For example, applying a blur value that results in the elimination of a jog implies that jog was not important to the OPC result. However, it is generally not possible for the mask manufacturer to properly assess this impact without knowledge of the wafer (optical and resist) models used to create the OPC solution. In other words, by applying target smoothing of Manhattan mask, the mask manufacturer is modifying the mask target. Doing so without proper lithography characterization is not recommended.

Another model-based mask data preparation method, discussed in a paper entitled "Writing 'wavy' metal 1 shapes on 22 nm logic wafers with less shot count," Zable et al., Photomask Japan 2010, which is incorporated herein by reference, takes advantage of circular apertures and allows the shots to overlap on purpose. Overlapping circular shots can produce better edge slope at the line ends of the SRAF. In a MDP process, every e-beam shot is simulated to produce the dose map that each shot contributes to the mask surface. Short-range (including forward scattering, short-range e-beam blur) as well as long-range (including backscattering) effects are modeled, producing a dose map on the mask surface. That dose map cut off at a certain resist threshold value (e.g, 0.5) produces a contour that is predicted to be printed on the mask surface. By taking the model-based approach, any character shot, not just a circular or a variable shaped beam shot of any dose can be properly modeled. This adds a large amount of flexibility in how e-beam shots are combined to produce the desired shape on the mask.

Two alternative flows based on the above model-based mask data preparation method are possible. One is to deploy conventional fracturing first, followed by model-based mask data preparation where conventionally fractured shots are improved either in shot count, edge slope, or both for certain of the shapes. The other is to divide the design into conventional parts and complex parts where the conventional parts are handled by conventional fracturing and complex parts are handled by model-based mask data preparation. In the latter flow, however, unless the sections of data are sufficiently isolated from each other, model-based mask data preparation needs to be able to "see" the conventionally fractured shots for proximity effects.

Inverse Lithography

While traditional or conventional OPC can be employed to repair layout design defects that would cause print errors, as discussed in the U.S. Pat. No. 7,926,002, inverse lithography may lead to a better or simpler repair approach.

Traditional OPC, while often referred to as "Model-based OPC" (MBOPC), usually comprises a mixture of rules and models. An example of a correction flow traditionally used with MBOPC is described in FIG. 8. The correction flow includes four basic steps: Step 1 shows an initial layout feature before correction, step 2 shows the layout feature after fragmentation and the initial optical/resist simulation, step 3 shows a typical mask result during correction and step 4 is the final simulated contour overlaid with the initial design layout.

After input of the designer's layout (step 1) the layout is fragmented (step 2). Fragmentation is the process by which the layout is divided into movable fragments, within which the edge-placement error (EPE) is computed. Fragmentation is needed to produce a manufacturable mask, and to simplify the OPC algorithm. In the next step (step 3) the mask is repeatedly simulated and the fragments displaced to gradually reduce the EPE to zero. The resulting output (step 4) should be a mask which enables faithful reproduction of the designer's intent on the wafer (limited by e.g., the diffractive nature of the imaging optics).

The above OPC flow can present several practical challenges to an OPC engineer. For example, fragments are most easily placed using a set of rules, which becomes increasingly more complex with each successive technology shrink. Image-based or adaptive fragmentation may alleviate some of these fragmentation challenges. Another challenge is related to MEEF. Each fragment is typically assigned a displacement to correct the EPE within the fragment in the above flow. However, in tightly-packed areas with high-MEEF, the movement of other fragments in the region can have a large impact on the EPE within the current fragment. The simplest solution to this problem is to apply a dampening (feedback) factor to the computed EPE, and repeatedly iteration to achieve a stable solution. Another proposed solution is the Matrix OPC concept where a MEEF Matrix is computed and inverted to more accurately determine the displacement for all fragments in a given region. Although solutions to the above problems (and others) exist, the solutions often involve an increased level of complexity in the OPC flow.

Inverse lithography, sometimes referred to as extreme OPC, inverse OPC, or pixOPC, treats the proximity correction problem as a constraint optimization problem over the domain of pixilated masks. Large pieces of the layout are usually broken down into rectangular frames. The sizes of frames may be dictated by the memory resources of the hardware, and ability to perform fast Fourier transformations. The frames are independently corrected for proximity effects, and then the frames are stitched together.

For each frame, the main objective G is a functional that expresses a deviation of the image $I(x,y)$ from the threshold constant T along the target contours $C_i$ of the frame:

$$G = \sum_i \oint_{C_i} (I(\xi, \eta) - T)^2 dl \to \min \qquad (1)$$

Here $\zeta=\zeta(l)$ and $\eta=\eta(l)$ are Cartesian coordinates along the target contours; dl represents a contour integration element. The image I(x,y) is controlled by the mask, thus the main functional G depends on the mask transmission m=m(x,y), a complex-valued piece-wise constant function. Thus the constrained optimization problem may be stated as finding the mask m=m(x,y) that minimizes $$G[m] \to \min, \qquad (2)$$

while constraining acceptable values of the mask transmission function to the constants $m_{min}$ and 1. For chrome masks $m_{min}=0$. For OMOG masks $m_{min}$ is a complex constant $m_{min} \approx (0.023, -0.022)$. The inverse lithography tries to find an analytical representation of the gradient of the objective, and then may use fast Fourier transformation to quickly calculate it.

The analytical expression for the gradient of the objective can be found by perturbing the mask m→m+δm and then finding the linear part of the perturbation of the objective δG. In the case of the objective (1), the following analytical expression for the gradient may be obtained:

$$g(x, y) = 4Re \sum_{k=1}^{N} \lambda_k \sum_i \int_{C_i} (I(\varsigma, \eta) - T) A_k^*(\xi, \eta) K_k(\xi - x, \eta - y) dl \qquad (3)$$

$$I(x, y) = \sum_{k=1}^{N} \lambda_k A_k^*(x, y) A_k(x, y)$$

$$A_k = K_k(x, y) \otimes m(x, y)$$

where N is the total number of optical kernels, $\lambda_n$ are weights of the optical kernels, $A_n$ is the electrical field from the n-th kernel $K_n$. The discretized version of (3) can be quickly calculated through fast Fourier transformations.

The gradient g(x,y) of the objective is used in the iterative procedure to move mask contours or to modify mask transmissions in a manner that reduced the value of the objective function G. Sub-resolution assist features (SRAFs) are automatically generated in an inverse lithography process. Thus, the inverse lithography can also be used for SRAF repair.

OPC and MDP Integration

Figure 3:
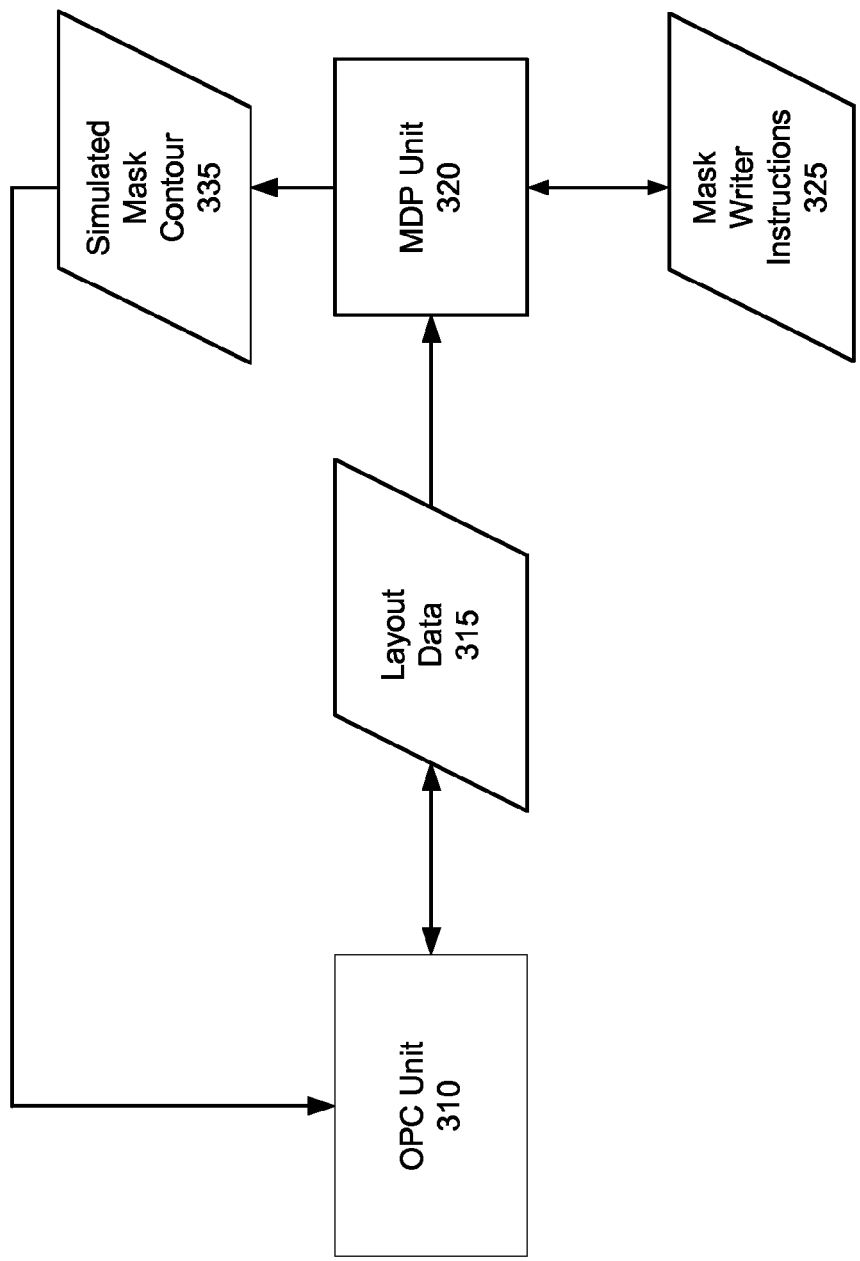
FIG. 3 illustrates an OPC-MDP tool according to various implementations of the invention.

Integration of OPC and MDP can derive a mask shape target that optimizes relevant measures of both underlying physical processes: mask manufacturing and wafer manufacturing. FIG. 3 illustrates an example of an OPC-MDP tool 300 that may be implemented according to various embodiments of the invention. As seen in this figure, the OPC-MDP tool 300 includes an OPC unit 310 and an MDP unit 320. An OPC process is applied on layout design data 315 by the OPC unit 310. The altered layout design data serve as mask target for a mask data preparation process conducted by the MDP unit 320. The mask data preparation process produces mask writer instructions 325. The MDP unit also simulates the mask writer instructions to produce simulated mask contour data 335.

According to some embodiments of the invention, one or both of the OPC unit 310 and the MDP unit 320 may be implemented by one or two computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or both of the OPC unit 310 and the MDP unit 320. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 4:
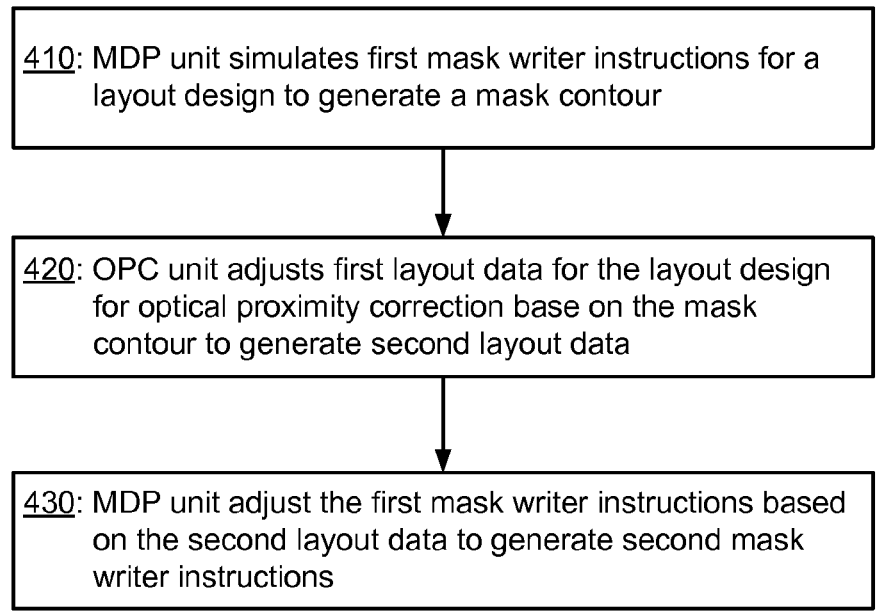
FIG. 4 illustrates a flow chart describing an OPC and MDP integration method according to various implementations of the invention.
Figure 4:

For ease of understanding, OPC and MDP integration methods that may be employed according to various embodiments of the invention will be described with reference to the OPC-MDP tool 300 in FIG. 3 and the flow chart 400 illustrated in FIG. 4. It should be appreciated, however, that alternate implementations of an OPC-MDP tool may be used to perform the OPC and MDP integration methods illustrated by the flow chart 400 according to various embodiments of the invention. Likewise, the OPC-MDP tool 300 may be employed to perform other OPC and MDP integration methods according to various embodiments of the invention.

Initially, in operation 410 of the flowchart 400, the MDP unit 320 simulates first mask writer instructions for a layout design to generate a mask contour. The layout design represents at least a portion of an integrated circuit design. The first mask writer instructions may be derived from an initial MDP operation that performs a conventional fracturing process on initial layout data, from a previous iteration of the process illustrated by the flowchart 400, or an MDP global operation. The latter two will be discussed in detail below.

Next, in operation 420, the OPC unit 310 adjusts first layout data for the layout design for optical proximity correction base on the mask contour to generate second layout data. The first layout data may be the initial layout data or the layout data from a previous iteration of the process illustrated by the flowchart 400. In a corresponding traditional OPC step, layout data are adjusted based on edge placement error data. The edge placement error data are obtained by comparing the wafer target with simulated wafer print features. The simulation usually does not consider effects of fracturing and mask proximity correction. The OPC step based on inverse lithography also does not consider these effects. The mask contour, on the other hand, includes them and may help the OPC unit 310 to make a better layout adjustment no matter whether a traditional OPC approach or an inverse lithography approach is implemented.

Next, in operation 430, the MDP unit 320 adjusts the first mask writer instructions based on the second layout data to generate second mask writer instructions. The second layout data serve as mask target. Various model-based mask data preparation approaches such as the two described in a previous section may be implemented by the MDP unit 320.

With various implementations of the invention, after the adjustments, the OPC-MDP tool 300 may determine whether one of the one or more end conditions is met. If none of the one or more end conditions is met, the OPC-MDP tool 300 may iterate the operations 410-430. One such end condition may be whether the adjustments performed by the OPC unit 310 and the MDP unit 320 are converged. For example, if residue mask and wafer errors are less than threshold error values, the OPC-MDP tool 300 may exit the iteration. Another end condition to check may be whether the number of iterations reaches a threshold number.

The initial input of layout data and mask writer instructions for the above iteration operation may be derived by an OPC global operation and an MDP global operation. With various implementations of the invention, the OPC global operation specifies the topology of the mask by defining the number, shape and general location of mask shapes while the OPC local operation refines edge/vertex locations within small special neighborhood. The MDP global operation defines the number, approximate size and location of the e-beam shots for the mask writer while the MDP local operation performs a refinement process such as adjusting the e-beams shots for corner locations.

Figure 5:
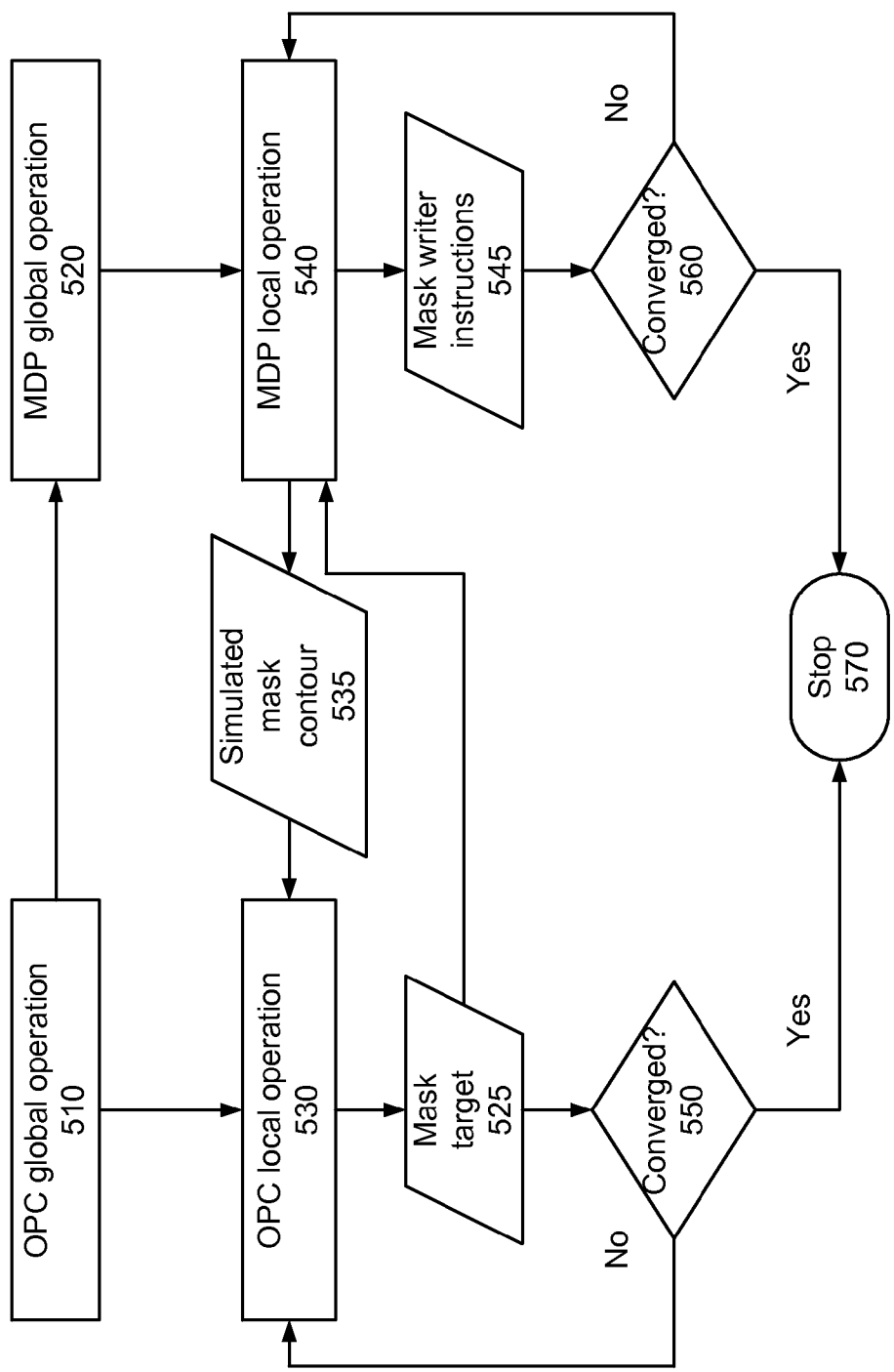
FIG. 5 illustrates a flow chart describing an OPC and MDP integration method that use outputs of global operations as initial inputs to OPC/MDP local iterations according to some implementations of the invention.

FIG. 5 illustrates a flow chart describing an OPC and MDP integration method that use outputs of global operations as initial inputs to OPC/MDP local iterations according to some implementations of the invention. In operation 510, an OPC global operation is performed on original layout data to produce initial layout data, which serve as input to both MDP global operation 520 and OPC local operation 530. In operation 520, an MDP global operation is performed on the initial layout data to produce initial mask writer instructions, which serve as input to an MDP local operation 540.

In operation 540, an MDP operation is performed on the initial mask writer instructions to produce mask writer instructions 545. Simulated mask contour data 535 are also produced to serve as input to the OPC local operation 530. In operation 530, an OPC local operation is performed on the initial layout data based on the simulated mask contour data 535 to produce mask target data 525. Convergence is checked at 550 and 560. If convergence conditions are not met, local operations are repeated. Rather than the initial layout data and the initial mask writer instructions, the newly produced mask target data and mask writer instructions serve as input to the operations 530 and 540, respectively. As will be appreciated by those of ordinary skill in the art, other end conditions such as the number of iterations may also be checked in operations 550 and 560.

As indicated by FIG. 5, the operations 410 and 430 may be performed by the MDP unit 320 simultaneous.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more non-transitory computer-readable media storing computer-executable instructions for causing one or more processors to perform a method, the method comprising:
   simulating first mask writer instructions for a layout design to generate a mask contour, the layout design representing at least a portion of an integrated circuit design, the mask contour being a contour that is predicted to be printed on the mask surface;
   adjusting first layout data for the layout design for optical proximity correction base on the mask contour to generate second layout data; and
   adjusting the first mask writer instructions based on the second layout data to generate second mask writer instructions.

2. The one or more non-transitory computer-readable media recited in claim 1, wherein the method further comprises:
   iterating the operations of simulating, adjusting first layout data and adjusting the first mask writer instructions until an end condition is met.

3. The one or more non-transitory computer-readable media recited in claim 2, wherein the end condition comprises a condition that both the layout data adjustment and the mask writer instructions adjustment are converged.

4. The one or more non-transitory computer-readable media recited in claim 1, wherein the operation of adjusting first layout data is one iteration of an optical proximity correction process.

5. The one or more non-transitory computer-readable media recited in claim 4, wherein the optical proximity correction process is based on inverse lithography.

6. The one or more non-transitory computer-readable media recited in claim 1, wherein the operation of adjusting the first mask writer instructions is one iteration of a model-based mask data preparation process.

7. The one or more non-transitory computer-readable media recited in claim 1, wherein the first mask writer instructions are generated by a global operation of a model-based mask data preparation process.

8. The one or more non-transitory computer-readable media recited in claim 1, wherein the first layout data are generated by a global operation of an optical proximity process.

9. A method, comprising:
   with a computer,
      simulating first mask writer instructions for a layout design to generate a mask contour, the layout design representing at least a portion of an integrated circuit design, the mask contour being a contour that is predicted to be printed on the mask surface;
      adjusting first layout data for the layout design for optical proximity correction base on the mask contour to generate second layout data; and
      adjusting the first mask writer instructions based on the second layout data to generate second mask writer instructions.

10. The method recited in claim 9, further comprising:
   iterating the operations of simulating, adjusting first layout data and adjusting the first mask writer instructions until an end condition is met.

11. The method recited in claim 10, wherein the end condition comprises a condition that both the layout data adjustment and the mask writer instructions adjustment are converged.

12. The method recited in claim 9, wherein the operation of adjusting first layout data is one iteration of an optical proximity correction process.

13. The method recited in claim 12, wherein the optical proximity correction process is based on inverse lithography.

14. The method recited in claim 9, wherein the operation of adjusting the first mask writer instructions is one iteration of a model-based mask data preparation process.

15. The method recited in claim 9, wherein the first mask writer instructions are generated by a global operation of a model-based mask data preparation process.

16. The method recited in claim 9, wherein the first mask writer instructions are generated by a global operation of a model-based mask data preparation process.

17. A system comprising:
   one or more processors, the one or more processors programmed to perform a method, the method comprising:

simulating first mask writer instructions for a layout design to generate a mask contour, the layout design representing at least a portion of an integrated circuit design, the mask contour being a contour that is predicted to be printed on the mask surface;

adjusting first layout data for the layout design for optical proximity correction base on the mask contour to generate second layout data; and adjusting the first mask writer instructions based on the second layout data to generate second mask writer instructions.

18. The system recited in claim 17, wherein the method further comprises:

iterating the operations of simulating, adjusting first layout data and adjusting the first mask writer instructions until an end condition is met.

19. The system recited in claim 17, wherein the operation of adjusting first layout data is one iteration of an optical proximity correction process.

20. The system recited in claim 17, wherein the optical proximity correction process is based on inverse lithography.

* * * * *